TRIODE MIXER CONSTRUCTION

Filed Aug. 31, 1948

INVENTOR
ALTON J. TORRE
BY Philip [signature]
ATTORNEY

Patented June 24, 1952 2,601,467

UNITED STATES PATENT OFFICE 2,601,467

TRIODE MIXER CONSTRUCTION

Alton John Torre, Westmont, N. J., assignor to Radio Corporation of America, a corporation of Delaware Application August 31, 1948, Serial No. 47,075

5 Claims. (Cl. 250—20)

This invention relates to triode mixer networks, more specifically to simple practical triode mixer constructions having high gain and stable operation.

It is generally known that the low level stages of electric-signal-receiving apparatus through which very low intensity signals are passed should be designed to introduce as little noise as possible into the signals in order to provide the maximum signal-to-noise ratio. It is also generally known that noise is introduced by electric signal transducers involving electron flow circuits such has electron discharge tubes, that the most noise is produced in multi-electrode electron flow circuits and the least noise by circuits having the least number of electron-flow electrodes. The signal receiving art has at the same time developed to the point where practically all radio receivers incorporate a low level converter arrangement in which incoming signals are heterodyned in a mixer stage with specially tuned waves to generate beat signals in a fixed frequency channel for further amplification by the more efficient fixed-frequency amlifiers. At the same time in the search for greater gain there have been developed pentagrid electron-discharge tubes which can be used in heterodyne converter or mixer circuits. The conversion gain of such circuits (the ratio of converted signal level to unconverted signal input) is so high as to raise the question of whether the desirability of low-noise triode transducers having only a single grid, overbalances the greater complications and expense of constructions hitherto necessary to make up for the lower amplification gain of the triodes.

Among the objects of this invention is the provision of novel and practical triode mixer circuits having output coupling arrangements that combine high conversion gain with simple construction.

Further objects of the invention include novel triode mixer constructions providing low-noise gain of such amount as to make unnecessary the use of pre-mixer signal amplification stages even for the reception of high frequency signals.

Still further objects of the invention are the provision of simple dual coupling arrangements for selectably connecting a triode mixer to provide converted signals in either of two frequency channels.

The above as well as additional objects of the invention will be best understood from the following description of exemplifications thereof, reference being had to the appended drawings wherein.

According to the invention a triode mixer is coupled to a signal utilizing apparatus by means of high-impedance parallel-tuned resonant circuits with a tapped portion connected across the mixer output leads to provide not only a lower-impedance load for better matching the low-impedance converted-signal output of the triode but also to provide an inductive load to the unheterodyned desired electric signal waves thereby increasing the mixer input impedance to the desired signals as well as the conversion gain. In addition symmetrical coupling and selectivity is inexpensively provided and practical existing coupling circiut constructions may be used.

Figure 1:
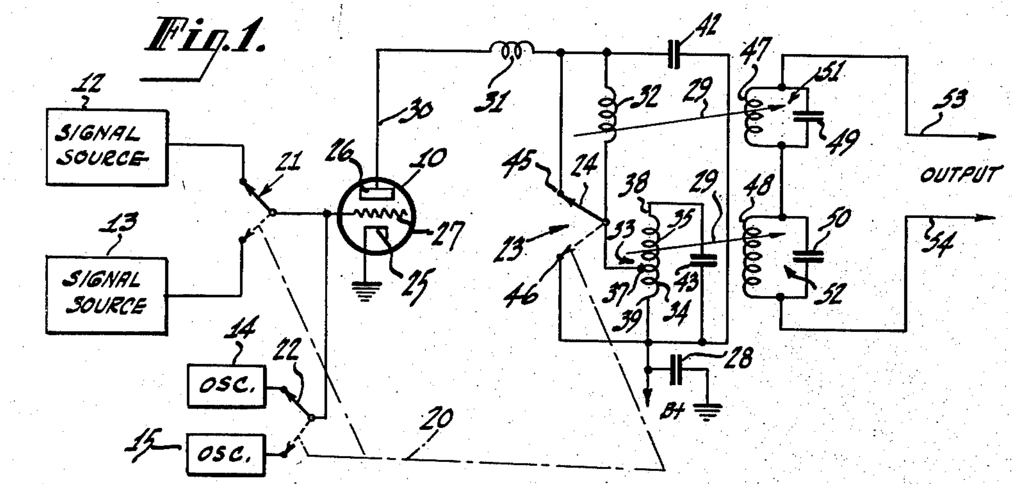
Fig. 1 is a schematic circuit diagram of one form of mixer construction embodying the invention, with parts shown in block diagram form.

Fig. 1 diagrammatically shows one form of the invention in which a triode mixer 10 is selectably supplied with incoming electric signal waves from either of two signal sources 12, 13 as well as with electric mixer waves from either of two sources such as oscillators 14, 15. The selection of the supplied signals and mixer waves is under the control of switches 21 and 22 which are interlinked or ganged for simultaneous operation, as indicated by the dash-dot lines 20. The signal sources 12, 13 may be different antenna systems or they may be the same general antenna system arranged to be switched simultaneously with the operation of switch 21 for supplying signals of different carrier frequencies. The mixer wave sources shown by the legend as oscillators 14, 15 are conveniently parts of a single oscillator assembly suitably connected for shifting the character of mixer waves delivered. If desired, separate oscillators may be used. The specific details of the sources 12, 13, 14, 15 form no part of the present invention and these units may have any suitable construction. One highly practical construction is shown in the copending application of B. S. Vilkomerson, Serial No. 46,594, filed on August 28, 1948, where the sources 12, 13 selectably supply standard broadcast amplitude-modulated (AM) or frequency-modulated (FM) radio signals.

The triode 10 is shown in the form of an electron-discharge tube having an electron-emitting cathode 25, an electron-collecting plate 26 and a control grid 27 between the cathode and plate for controlling the flow of electrons. As is well known, when the plate 26 is kept at a high positive potential with respect to the cathode 25, and the grid 27 biased to the proper D.-C. potential with respect to the cathode, voltage variations impressed between the grid and the cathode will cause the electron flow to the plate to be correspondingly varied. Accordingly there will be developed amplified voltage variations across a suitable impedance in the plate-supply circuit. When voltage variations of different frequencies are mixed or simultaneously impressed on the grid with respect to the cathode, the amplified signals will have components of both impressed variations together with other components having signal variations corresponding to sums and differences of the different impressed frequencies as well as their harmonics. This phenomenon is the heterodyne effect which is commonly utilized to convert incoming signals and shift their frequencies to a frequency channel in which the signals may be more readily utilized or amplified.

The construction of Fig. 1 shows the triode plate 26 connected to the positive terminal (B+) of a high voltage D.-C. energy source (not shown), the negative terminal of which is grounded and thereby connected to the cathode 25. The plate circuit is established through plate lead 30, inductance 31 and a path including either inductance 32 or a portion 34 of inductance 33. An additional switch 23 having a movable contact element 24 connected to the lower end of inductance 32 is arranged to selectably engage either of a pair of fixed contacts 45, 46 for effecting the alternative plate circuit connections as described. The switch 23 short-circuits the inductance which is not in use, and may be ganged with the other switches 21, 22 for simultaneous operation.

The inductance 33 is divided into two portions 34, 35 by a tap 37 and only the portion 34 is placed in the direct current plate circuit by the connection of the tap 37 to the movable switch contact element 24 and the connection of the lower end 39 to the B+ terminal. A capacitance 42 is connected between the upper end of inductance 32 and the fixed switch contact 46 for tuning inductance 32 to a desired frequency when the inductance portion 34 is short-circuited by switch 23. Another capacitance 43 is connected across the ends 38, 39 of inductance 33 and is tuned with this inductance to a different frequency.

Magnetically coupled to inductance 32 is another inductance 47, the inductance 33 being also magnetically coupled to a further inductance 48. The magnetic couplings are represented by the arrows 29. Each inductance 47, 48 is connected as a separate parallel-resonant tuned circuit 51, 52 by means of respective capacitances 49, 50. The lower end of resonant circuit 51 is connected to the upper end of resonant circuit 52, while the other ends of these circuits go to output leads 53, 54.

In the form of the invention shown, upper parallel-resonant circuit 32, 42 is tuned to a frequency about 5 or more times as high as the lower parallel-resonant circuit 33, 43 and thus capacitance 42 has a relatively small value. Inasmuch as capacitance 42 appears across inductance portion 34 when the switch blade 24 is in the low frequency position illustrated, allowance is made for the added capacitance when tuning the lower circuit. The resonant circuits 51, 52 are tuned to the same frequencies as the circuits to which they are coupled. Inductance 31 is of such low value as to be significant only in the high frequency circuit 32, 42. For the low frequency circuit 33, 43 this inductance may be ignored. At 28 there is indicated the capacitance conventionally shunted across the D.-C. plate circuit energizing source to prevent the appearance of signals across its terminals, between B+ and ground.

In operation the cathode 25 is heated to a temperature at which it becomes suitably electron-emissive, and the desired signals are supplied to the grid. The grid is properly biased in any convenient manner (not shown). In the illustrated position of the switch gang 20, switch 21 connects the input grid 27 to low frequency signal source 12 while switch 22 links it with the low frequency mixer wave source 14. Although only a single lead is diagrammatically shown as providing the input connections from each source, a return lead, not shown, is connected to the cathode as by a common ground conductor. Both sources 12 and 14 have two terminal outputs one terminal of each of which may be grounded, or alternatively one source may have a grounded terminal and the other source may have its output not directly grounded but merely connected in series with the grounded source. The pair of sources 13, 15 may be similarly connected or the different pairs may have different types of connections.

Mixer wave source 14 is adjusted, as by conventional heterodyne technique, to provide waves of such frequency as to beat or heterodyne with the signals from source 12 to provide beat signals in a beat or intermediate frequency channel generally of lower frequency than the incoming signals. The parallel resonant circuit load 33, 43, together with the additional capacitance due to capacitance 42, is tuned to a frequency at about the center of this channel.

An important feature of the invention is the insertion of only a smaller portion 34 of the inductance 33 in the resonant output network of the plate circuit. Since this leaves a larger portion 35 of the inductance and a series capacitor 43 in shunt with the smaller inductance portion 34, and since the capacitor 43 has a low impedance to signal frequencies the plate load looks like two parallel inductances. This has the effect of presenting in the plate circuit a load that is inductive to the incoming signal frequencies supplied by source 12. The load is therefore inductive even though the incoming signal frequencies are higher than a resonant frequency of the entire tuned circuit 33, 43. This is so even though prior art resonant circuits are normally capacitive to signals having frequencies above resonance. Another way of considering the operation is that inasmuch as capacitance 42 is small and therefore is absorbed by the resonant circuit, and inasmuch as the inductance portion 34 is smaller than the shunted inductance portion 35, for non-resonant higher frequency signals substantially the only load in the plate circuit is the inductance portion 34. Therefore, the construction of the invention provides inductive loading of the triode output for incoming signals whether or not capacitor 42 is connected.

For best operation of a triode amplifier, the output load should be inductive to incoming signals thereby compensating for the normally large input-to-output interelectrode capacitance and increasing the triode input impedance for the incoming signals. In the mixer construction of the invention the incoming signals impressed on the triode input are of different frequency than the converted output signals, but with the simple tapping of a resonant output circuit, the load is adjusted to be resonant to the converted signals, for good selectivity, and inductive to the incoming signals for high gain. Another effect of the tapped loading is that it enables the closer matching of the mixer output impedance to high-impedance high Q resonant output circuits which have better selectivity.

In accordance with the above theoretical explanation, highly amplified converted output signals appear in the resonant circuit 33, 43 and because of the magnetic coupling, are induced in circuit 52. Because the resonant circuit 51 is tuned a frequency about 5 times that of circuit 52 with which it is in series, circuit 51 presents substantially no impedance to the signals in the low frequency channel which are available in substantially undiminished intensity across output terminals 53, 54.

When the switches of gang 20 are shifted to their opposite positions, shown in dash lines, the mixer input is switched to signal source 13 and mixer wave source 15. At the same time the triode output is shifted from low frequency resonant circuit 33, 43 to high frequency resonant circuit 32, 42. The operation of the apparatus in this condition is generally similar to that described above except that in the form shown, inductance 31 is relied on for making the output inductive to incoming signals. The converted high frequency channel may be of lower frequency than the signals supplied for conversion, as in the standard FM receiving technique where the incoming signals are in the 88 to 108 megacycle per second band and the converted channel centers about approximately 10 megacycles or less per second. In such case the inductance 31 is quite small and may merely be the short length of conductor such as 30 which is normally required to establish the desired interconnection between the plate 26 and inductance 32. The desired converted signals in resonant circuit 32, 42 induce corresponding signals in resonant circuit 51 which are also available across output terminals 53, 54 because of the insignificant impedance presented by resonant circuit 52.

If desired, the tap-down feature of the invention may be incorporated in a receiver construction having only a single converted signal channel. Alternatively it may be used in the high frequency triode output channel of the construction of Fig. 1 together with or instead of the low frequency channel tap-down. Other modifications include the use of separately coupled output circuits 51, 52 not connected to each other. One of the signal sources 12, 13 may be omitted as where it is desired to selectively pass the same signals through either converted frequency channel. Conversely where the signals supplied by sources 12, 13 are suitably related in frequency, a single oscillator may be used without oscillator switching to selectably convert these signals to either of the output channels. Furthermore the channel selector switch 24 may be arranged to switch capacitance 42 in and out of the triode output circuit so that it is not present when the low frequency channel is used, as explained above.

In place of the autotransformer construction provided by the novel tap-down primary per se, either or both of the primary windings of the coupling transformer may have an additional magnetically coupled winding for direct insertion in the triode plate circuit. By proper adjustment of the number of turns in the additional windings the desired tap-down effect may be obtained with a two-winding transformer primary. The additional windings are adjusted not to resonate to a frequency at or below the incoming signal frequencies, so that the load for such signal is always inductive. One simple method of adjusting the resonance of the additional windings is by not connecting a parallel capacitance and merely leaving them untuned except for their distributed capacitance.

Another feature of the invention is the simple output circuit switching arrangement utilizing capacitances 42, 43 which may have a common electrode. These capacitances together with capacitances 49, 50 are preferably provided in a unitary assembly including the inductances with which they are resonated. This enables the simple manufacture and adjustment of these components to their approximate final values. The actual value required in any receiver may vary somewhat due to differences in the stray capacitances of the assemblies in which the units are incorporated. Switching of the triode output loads is also desirable to prevent interference due to the undesired pickup of spurious signals otherwise possible from the large number of oscillator harmonics present.

In the development of dual channel intermediate frequency transformer assemblies, cost and bulk and performance considerations have been satisfied by constructions in which all the capacitances are provided in pairs with a common capacitance electrode in each pair. Each pair may be formed of a single member, or the same member may provide both capacitance pairs.

Figure 2:
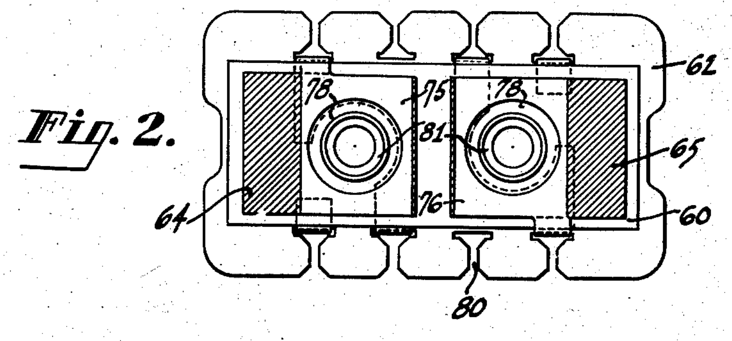
Fig. 2 is a plan view of a condenser assembly that may be used in practical constructions of the apparatus of Fig. 1.
Figure 3:
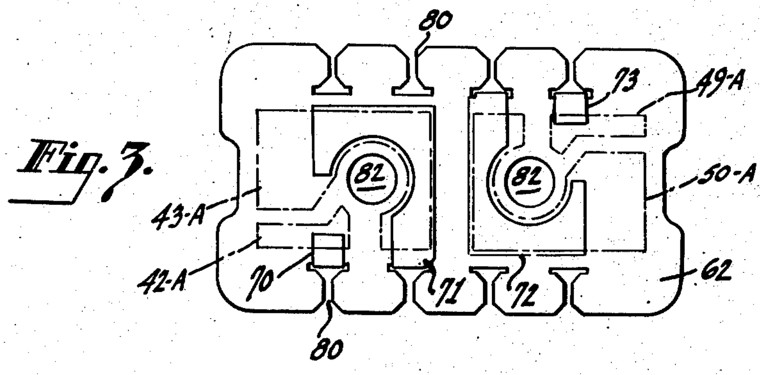
Fig. 3 is a view similar to Fig. 2 with parts removed showing further details of the condenser assembly.

Figs. 2 and 3 are views of a practical capacitance assembly of this type, as shown in the copending Mackey application Serial No. 17,359, filed March 26, 1948, now Patent No. 2,544,508 granted March 6, 1951. A sheet of dielectric 60 such as mica is coated on portions of both its sides with conductive material and held in place on a non-conducting retaining strip 62. On the upper surface of the dielectric 60, shown in Fig. 2, the coating is divided into two generally rectangular portions 64, 65. The coating on the lower side is presented in Fig. 3, which is a view similar to Fig. 2 with the dielectric sheet and overlying material removed, as formed of portions 42–A, 43–A, 49–A, 50–A shown by dash-dot bounding lines. Between the dielectric 60 and base 62 are placed flat contact ears 70, 71, 72, 73, each of which forms an integral part of a separate terminal lug. The remainder of the terminal lug portions are directed downward perpendicularly to the flat ears and fit through T-shaped slots 80 in the base to provide convenient solder connection terminals.

Above the coated dielectric 60, the contact ears 75, 76 of other terminal lugs mounted, and all parts held in place by rivets 81 penetrating through aperture 82 in the strip 62, and clamped against the lower face of the strip and the upper face of ears 75, 76. Between the upper ears 75, 76 and the rivets, resilient elements such as spring washers may be inserted to maintain the desired engagement between the contact ears and the conductive coating portions. The rivets may also be used as supports against which the inductances are mounted, as described in the above-mentioned Mackey application.

The desired capacitance 42 of Fig. 1 is provided between coatings 42–A and 64 on opposite sides of the dielectric. Capacitance 43 is provided between coatings 43–A and 64 while coatings 49–A and 65 furnish capacitance 49 and coatings 50–A and 65 the capacitance 50.

It is noted that a minimum of parts and anchoring elements are necessary with the capacitance assembly construction of Figs. 2 and 3. Furthermore the resilient clamping engagement that furnishes all the capacitance contacts includes only one non-metallic link, the strip 62, and has the least possible susceptibility to cold flow and consequent loss of proper contact.

According to this phase of the invention such highly desirable capacitor pair constructions with a common electrode may be utilized for the capacitances 42, 43 notwithstanding the fact that when one of the capacitance circuits is switched out of the triode output circuit, its capacitance is not removed from this circuit. This construction has been found extremely satisfactory in that it requires only a simple single-pole double-throw output circuit switch 24 and does not deleteriously affect the operation of the apparatus.

While several exemplifications of the invention have been indicated and described above, it will be apparent to those skilled in the art that other modifications may be made without departing from the scope of the invention as set forth in the appended claims.

What is claimed is:

1. In a dual frequency mixer network for producing frequency-converted signals in two separated frequency channels; a triode mixer having a control electrode and output electrodes, a source of mixer waves connected to said control electrode, utilizing structure for said converted signals, means electrically coupling said output electrodes and said utilizing structure including resonant circuit elements providing first and second parallel resonant circuits, each of said circuits being tuned to present a high impedance to said converted signals in a different one of said frequency channels, said first parallel resonant circuit having an inductive branch and a capacitive branch connected between said output electrodes, said second parallel circuit including an inductor and a capacitor, a portion of said inductor being connected between said output electrodes and the remainder of said inductor being in series with said capacitor, the said capacitor and remainder of said inductor being connected in shunt with said portion of said inductor whereby said portion of said inductor provides an inductive load for said triode mixer at signal wave frequency for one of said frequency channels to increase the gain of said triode mixer, and selector structure operative to short-circuit said inductive branch of the first circuit and said portion of said inductor of the second circuit selectively, whereby said circuits are selectively operable in connection with said output electrodes and said network is conditioned for dual channel signal response.

2. A dual frequency mixer network as defined by claim 1, in which the resonant-circuit elements include coupling transformers having windings inductively coupling said utilizing structure to said output electrodes.

3. A dual frequency mixer network as defined by claim 2, in which said coupling transformers are enclosed within a single shield container and include transformer windings and a series of tuning capacitors for said windings in the resonant coupling circuits as the tuning means therefore; said capacitors having a constructional configuration providing one electrode in common with at least two of said resonant coupling circuits.

4. A dual frequency mixer network as defined by claim 1, in which said selector structure is also connected to selectively impress on the mixer control electrode incoming signal waves lying in either one of two different frequency ranges.

5. A dual frequency mixer network as defined by claim 1, in which the selector structure is also connected to impress on the mixer control electrode amplitude-modulated signals and frequency-modulated signals selectively.

ALTON JOHN TORRE.

REFERENCES CITED

The following references are of record in the file of this patent:

UNITED STATES PATENTS

| Number | Name | Date |
|---|---|---|
| 2,122,257 | Loughlin | June 28, 1938 |
| 2,159,546 | Bauer | May 23, 1939 |
| 2,167,605 | Carlson | July 25, 1939 |
| 2,209,959 | Chittick | Aug. 6, 1940 |
| 2,215,774 | Andreatta | Sept. 24, 1940 |
| 2,280,521 | Foster | Apr. 21, 1942 |
| 2,289,147 | Shea | July 7, 1942 |
| 2,295,383 | Carlson | Sept. 8, 1942 |
| 2,354,959 | McCoy | Aug. 1, 1944 |
| 2,370,758 | Thompson | Mar. 6, 1945 |
| 2,383,322 | Koch | Aug. 21, 1945 |
| 2,404,669 | Tillman | July 23, 1946 |
| 2,419,984 | Boothroyd | May 6, 1947 |
| 2,430,835 | Strutt | Nov. 11, 1947 |
| 2,443,935 | Shea | June 22, 1948 |